(12) United States Patent
Baggen et al.

(10) Patent No.: US 7,174,497 B2
(45) Date of Patent: Feb. 6, 2007

(54) METHOD OF STORING OR DECODING A STREAM OF BITS

(75) Inventors: Constant Paul Marie Jozef Baggen, Eindhoven (NL); Marten Erik Van Dijk, Eindhoven (NL); Willem Marie Julia Marcel Coene, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 1033 days.

(21) Appl. No.: 09/933,791

(22) Filed: Aug. 21, 2001

(65) Prior Publication Data

US 2002/0094033 A1 Jul. 18, 2002

(30) Foreign Application Priority Data

Aug. 22, 2000 (EP) .................................. 00202931

(51) Int. Cl.
*H03M 13/00* (2006.01)
(52) U.S. Cl. ............... 714/776; 714/788; 714/782; 714/821
(58) Field of Classification Search ............ 714/776, 714/788, 821, 793, 748, 715, 807, 782
See application file for complete search history.

(56) References Cited

U.S. PATENT DOCUMENTS

| | | | | |
|---|---|---|---|---|
| 4,439,859 A | * | 3/1984 | Donnan | 714/748 |
| 5,185,862 A | * | 2/1993 | Casper et al. | 709/236 |
| 5,220,568 A | * | 6/1993 | Howe et al. | 714/782 |
| 5,282,209 A | * | 1/1994 | Bonnerot | 714/821 |
| 5,408,475 A | * | 4/1995 | Lee | 714/715 |
| 5,862,160 A | * | 1/1999 | Irvin et al. | 714/807 |
| 2004/0169595 A1 | * | 9/2004 | Kalker et al. | 341/53 |

FOREIGN PATENT DOCUMENTS

WO WO0057416 9/2000

* cited by examiner

*Primary Examiner*—Guy Lamarre
*Assistant Examiner*—Fritz Alphonse
(74) *Attorney, Agent, or Firm*—Michael E. Belk

(57) ABSTRACT

The invention relates to a method of storing a number of data bits of a secondary channel (30) in the frame of a main channel (20) and to a method of decoding a stream of bits relating to a secondary channel (30) embedded in the frames of a main channel (20) into a stream of data bits (62). In order to enable a certain synchronization and to guarantee a fixed amount of storage capacity in the secondary channel as well as to be able to correct deletions or insertions of bits in the secondary channel it is proposed according to the invention to form a secondary frame (11) having a fixed number of frame bits, to fill a fixed part of the secondary frame (11) with data bits (113), an end-bit (114) set to a first bit-value and, if necessary, with filling bits (115) set to a second bit-value, to encode the secondary frame (11) producing encoded data bits (113) and parity bits (112), which are finally embedded in the frame of the main channel (20). The invention relates also to a device for storing a number of data bits of the secondary channel (30) in the frame of a main channel (20) and to a device for decoding a stream of bits of relating to a secondary channel (30) embedded in the frames of a main channel (20).

19 Claims, 5 Drawing Sheets

METHOD OF STORING OR DECODING A STREAM OF BITS

Figure 1:
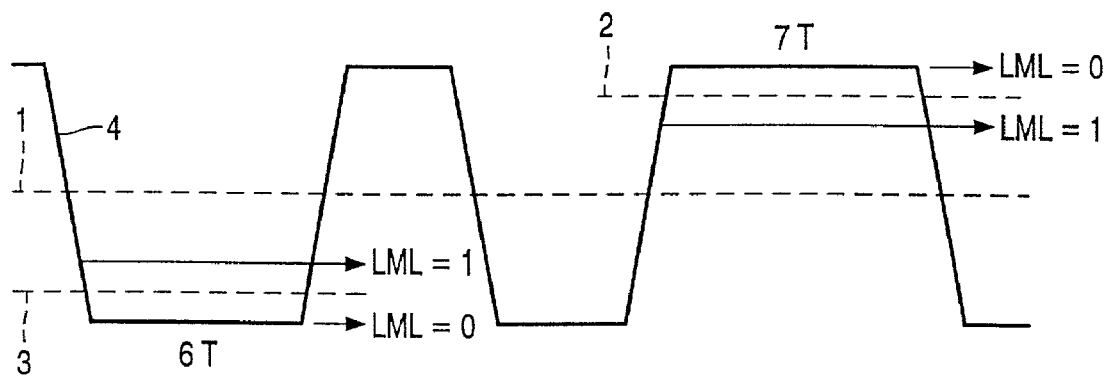

The invention relates to a method of storing a number of data bits of a secondary channel in the frame of a main channel comprising a fixed number of main channel bits and a frame synchronization signal. The invention also relates to a method of decoding a stream of bits relating to a secondary channel being embedded in the frames of a main channel into a stream of data bits. The invention relates further to a device for storing a number of data bits according to the preamble of claim 11, to a device for decoding a stream of bits according to the preamble of claim 12, to a medium according to claim 13 and to a signal according to claim 14.

The invention is applicable to record carriers with different kinds of channel codes. The information stored on these record carriers can be coded, for example, in accordance with a runlength-limited (RLL) code. A RLL code is characterized by two parameters, (d+1) and (k−1), which stipulate the minimum and maximum runlength, respectively, that may occur in the code. For example, different DVD-formats use a (d=2, k=10) RLL EFM+ code.

A method of decoding a stream of bits of a signal relating to a binary channel into a stream of bits of a signal relating to a binary source and a device for performing this method are described in non pre-published patent application WO 00/57416-A1. (PHN 17.369). According to this method the binary channel comprises a main channel and a secondary channel, the secondary channel being embedded in the main channel via multi-level coding. Another stream of corrected bits of the binary channel relating to the main channel is used for correcting errors in the stream of bits of the binary channel relating to the secondary channel.

In CD the use of the Eight-to-Fourteen modulation (EFM) code leads to runlength-limited waveforms satisfying the (2, 10)-constraint. These waveforms can be parsed into phrases, where each phrase corresponds to a land or to a pit. The phrases of the (2, 10)-constrained EFM code have runlengths between 3 and 11 channel bits. Each phrase is characterized by its length, i. e., there are phrases of runlength 3 which are called I3, up to phrases of runlength 11 which are called I11. A general idea of a limited-multi-level modulation (LML modulation) code is, to use a fine-splitting of the levels of the longer phrases. For example, the phrases I5 up to I11 may have a small indention in the middle of the phrase. The presence or absence of this indention corresponds to a storage of 1 extra bit in these longer phrases. The presence of these indention does not disturb the classical detection of the EFM modulation code.

In the classical CD channel, which is called main channel, the information is subdivided into EFM frames (F3-frames), where each F3-frame corresponds to 24 user bytes (6 stereo samples). The synchronization of the CD system and the main data error correction system (CIRC) is based on these F3-frames.

The use of an LML modulation code as it is described in the above-mentioned document leads to some particular problems:
1. Since the generation of EFM phrase lengths is a random process that is determined by the main channel, the occurrence of the longer phrase lengths satisfies a certain probability distribution. Hence, the amount of extra data bits (LML bits) that can be stored in an F3-frame of the main channel is a random variable. This uncertainty causes two problems:
    a) The use of an error correction system requires a form of synchronization, since an error correction code can only correct errors where symbol values have been made erroneous without having lost the synchronization. If the number of extra data bits (LML bits) per F3-frame is uncertain, synchronization is potentially difficult to acquire (e. g., after a random access) and to maintain.
    b) The user usually is interested in a fixed guaranteed storage capacity. Because of the randomness of data bit density in the secondary channel, this is not trivially achieved.
2. If an error is made during read-out such that a long phrase is taken for a short one (thus supposedly having no extra data bit) or vice versa, extra data bits are deleted or inserted. Such deletions or insertions lead to a loss of synchronization, for which error correcting codes are especially vulnerable.

The invention has therefore for an object to improve the methods and the devices mentioned at the beginning such that the above-mentioned problems are overcome.

According to the invention this object is achieved by providing a method of storing a number of data bits as claimed in claim 1 and by providing a method of decoding a stream of bits as claimed in claim 5. According to the invention the object relating to the devices is achieved by providing a device for storing a number of data bits as claimed in claim 11 and by providing a device for decoding a stream of bits as claimed in claim 12.

The invention is based on the recognition that the number of data bits that can additionally be stored in one frame of the main channel of a CD is a random number, which, however, is approximately Gaussian distributed (having a small peak on 63 bits due to the truncation) with a mean of 55.40 bits and a standard deviation of 3.93 bits. In order to allow a reliable decoding and synchronization, independent of the decoding of the main channel, secondary frames are formed having available a fixed number of frame bits which is for nearly all frames of the main channel higher than the number of additional bits, that can be stored and embedded in one frame of the main channel. As an example, for CD a secondary frame has 64 frame bits available.

In said secondary frame some frame bits are reserved for the parity bits of the error correcting code and some frame bits are filled with a number of data bits of the secondary channel such that the number of parity bits plus the number of data bits sum up to the number of bits being available in the associated frame of the main channel for storage of bits of the secondary channel. Behind these data bits an end-bit is set to a first bit-value and all remaining frame bits (filling bits) of the secondary frame, if there are any left, are set to a second bit-value. After error correction encoding only the encoded data bits and the parity bits of a secondary frame are embedded in the associated frame of the main channel but not the end-bit and the filling bits, which are also not stored.

During decoding the same secondary frame is formed by successively filling it first with the parity bits and the encoded data bits which are read e. g. from a disk. Behind the data bits an end-bit is set to the first bit-value and the remaining frame bits (i. e. the filling bits) of the secondary frame, if any, are set to the second bit-value. Thus, a secondary frame of the same format is formed as it has been formed during encoding. The secondary frame having a fixed length is now decoded by an error correction decoder thereby producing the data bits being embedded in the frame of the main channel.

As it is explained above according to the invention a secondary frame having a fixed number of frame bits is formed and then encoded or decoded, respectively. This has the advantage that the number of bits put into the encoder or the decoder, respectively, is known and certain, so that synchronization is easily possible and maintainable. Even if the number of bits that can be embedded in one frame of the main channel varies from frame to frame the number of bits of a secondary frame is always the same. A loss of synchronization can therefore not occur even if during read-out a bit embedded in the frame of the main channel is lost or inserted, e. g. due to a read-out error.

A preferred embodiment of the invention is described in claim 2. According to this method several secondary frames are combined forming a superframe which is then fed into the encoder. This has the advantage that the number of bits available for storage in the main channel is determined not only by one frame of the main channel but by a large number of frames of the main channel since each frame of the main channel is associated with one secondary frame of the superframe. Even if the number of bits that can be embedded in one frame of the main channel is different for each frame the storage capacity of a whole superframe is relatively fixed and can be determined in advance because of the law of large numbers.

An advantageous modification of the invention is described in claim 3. The id-bit, which is set during encoding, can be used during decoding to detect if one bit has been lost or inserted during read-out or during decoding. The id-bit can, e. g., set to one if the number of bits embedded in the frame of the main channel is even, and can be set to zero if the number is odd.

Still another modification in accordance with the invention is described in claim 4 according to which multi-level coding is used for embedding bits in the frame of the main channel. This is one possible and simple method to embed bits in the frame of a main channel which has already been described in non pre-published patent application WO 00/57416-A1 (PHN 17.369). There are, however, other possibilities conceivable.

Advantageous modifications of the method of decoding a stream of bits as claimed in claim 5 are described in claims 6 to 9.

According to another preferred embodiment the end-bit is set to one and the filling bits are set to zero, i. e. as first bit-value one and as second bit-value zero is preferably used. It is, however, also possible to use zero as the first bit-value and one as the second bit-value.

A device for storing a number of data bits according to the invention is described in claim 11, a device for decoding a stream of bits is described in claim 12. The invention refers further to a medium storing a number of data bits of the secondary channel in the frame of a main channel as claimed in claim 13 and a signal including a number of data bits of the secondary channel in the frame of a main channel as claimed in claim 14. It shall be understood that, even if not explicitly claimed, these devices, the medium and the signal can also be modified in the same or a correspondent way as it is described above with respect to the method of claim 1 or claim 5.

Figure 2:
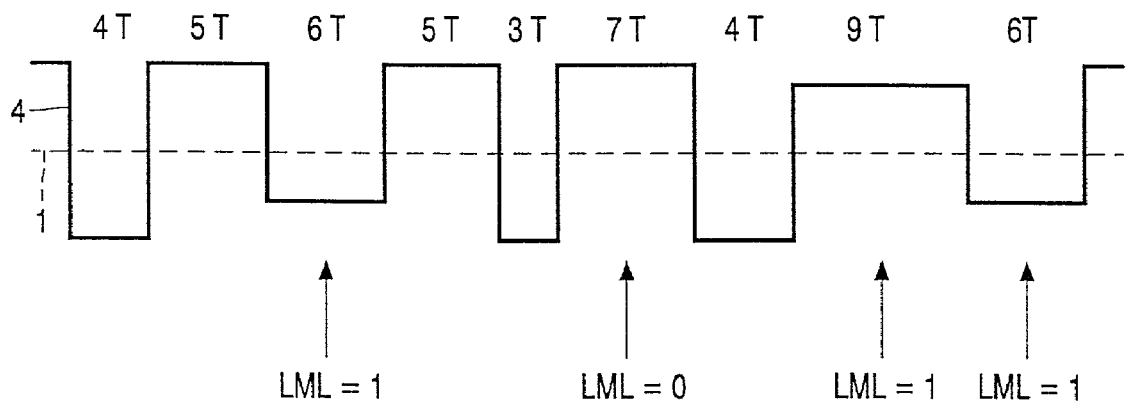
Figure 3:
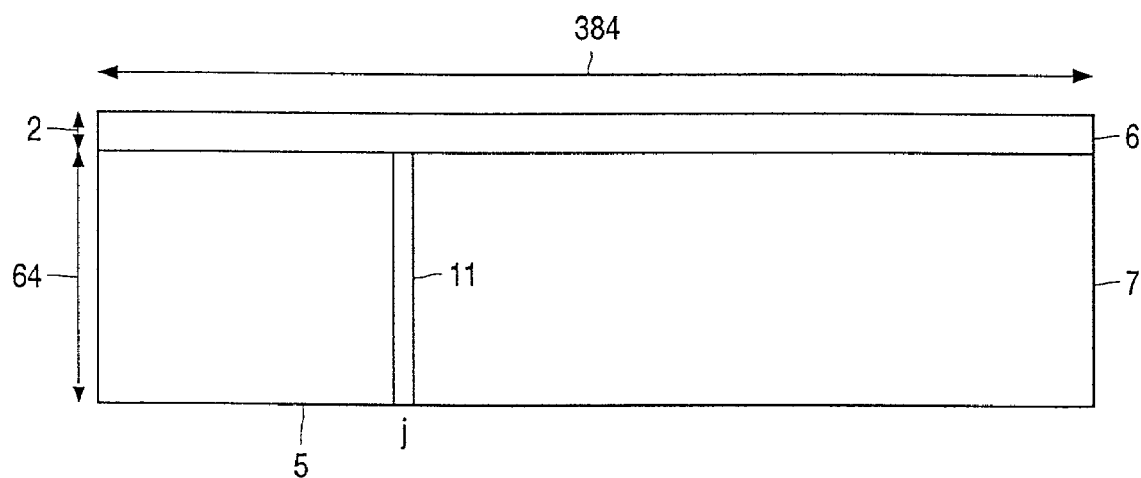
Figure 4:
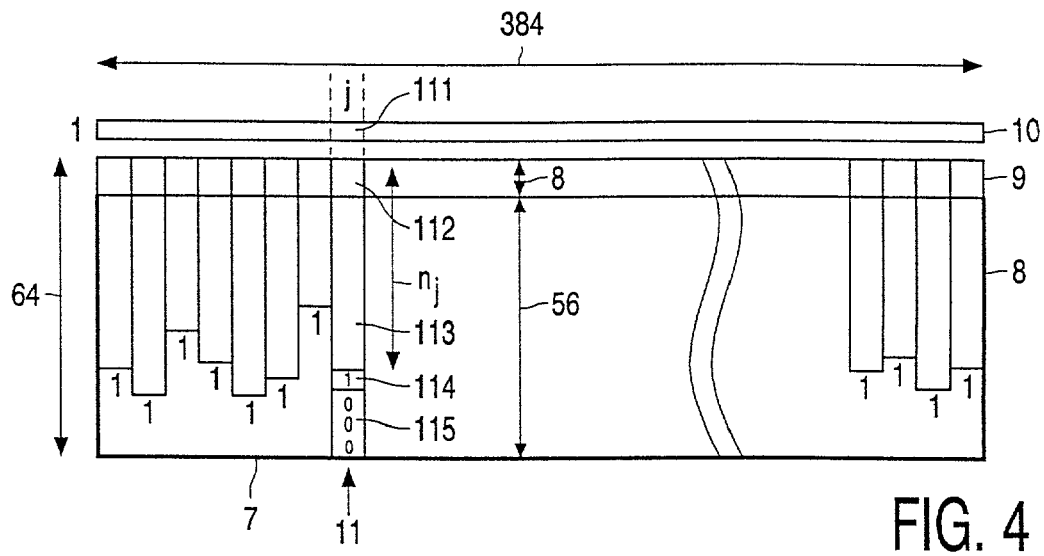
Figure 5:
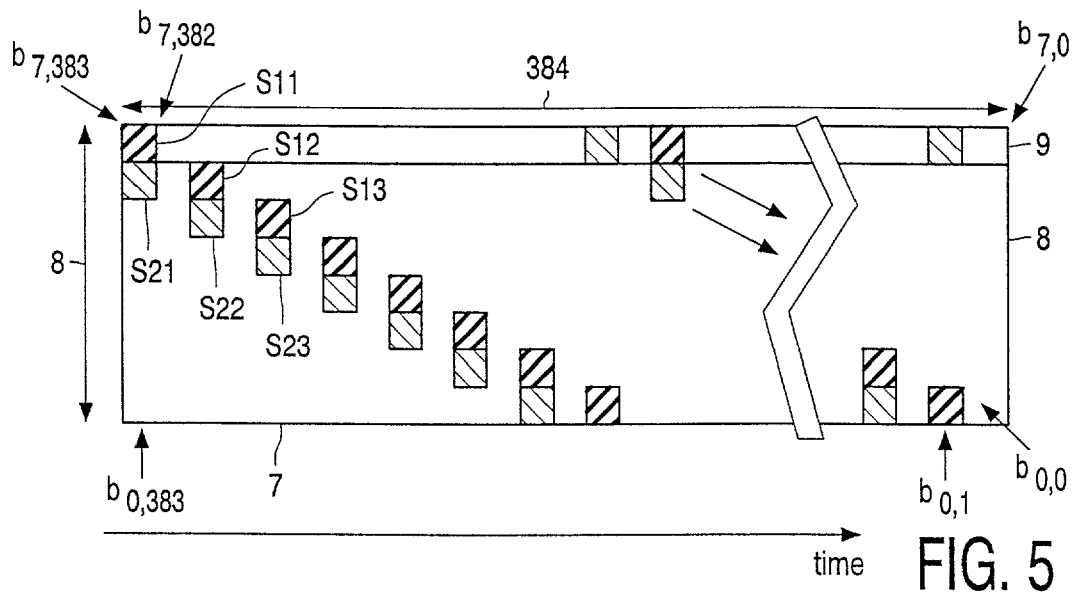
Figure 8:
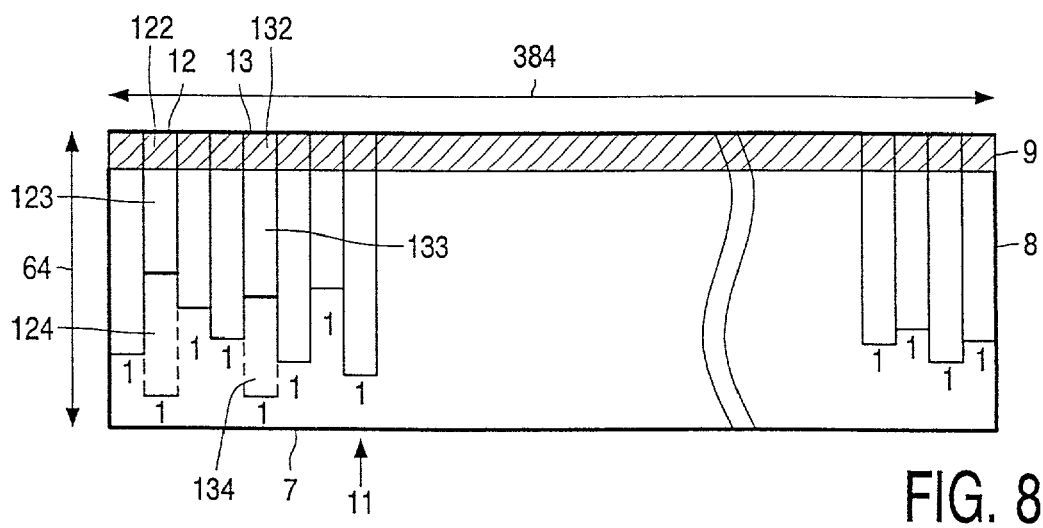
Figure 6:
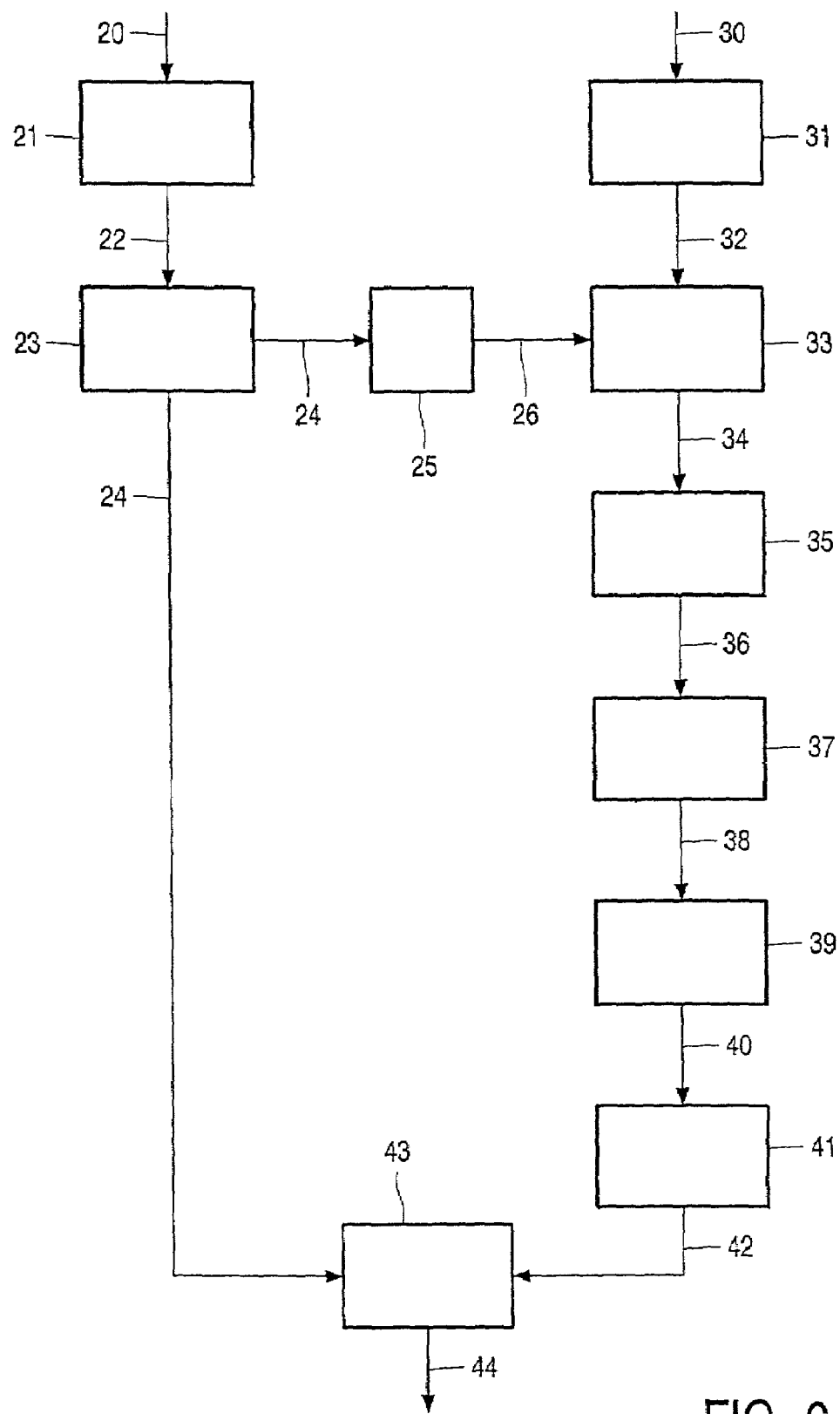
Figure 7:
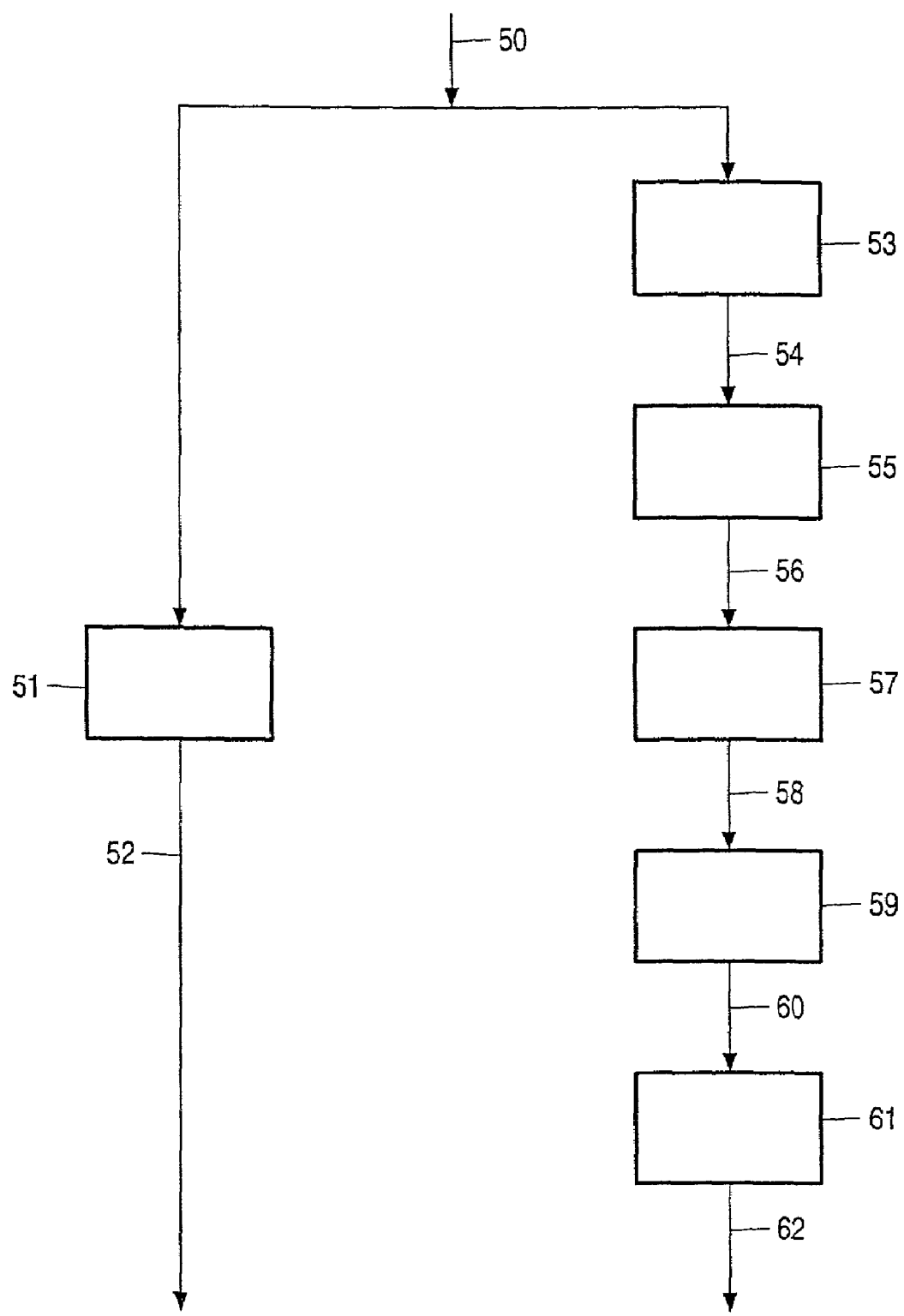
Figure 9:
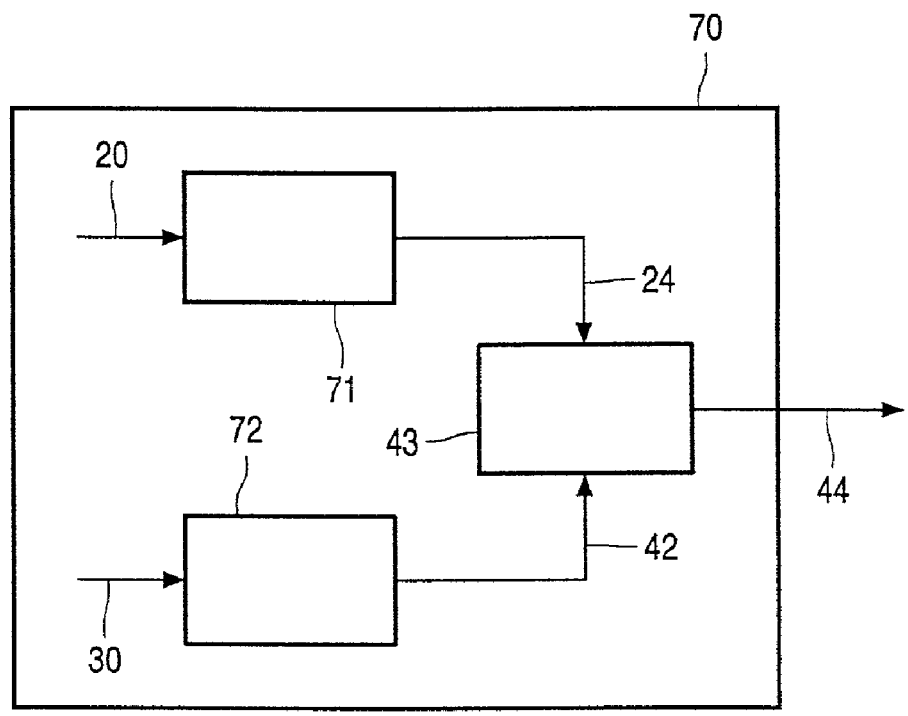
Figure 10:
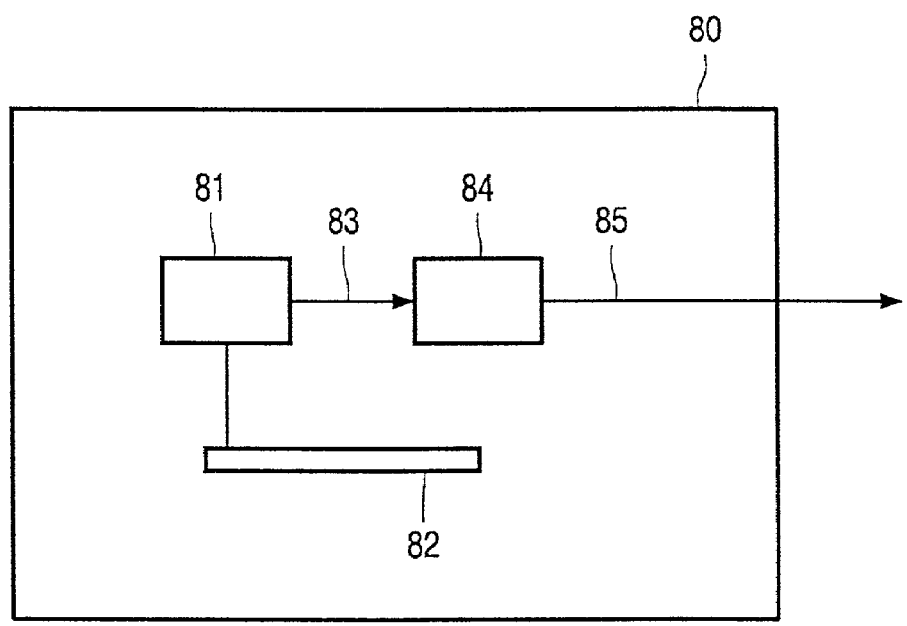

The invention will be described in more detail with reference to the accompanying drawing, in which:

FIG. 1 shows a diagram explaining multi-level coding,

FIG. 2 shows a stream of bits of the main channel where bits of the secondary channel are embedded, FIG. 3 shows the format of a superframe according to the invention, FIG. 4 shows the arrangement of bits in a secondary frame, FIG. 5 shows the arrangement of symbols of codewords in a superframe, FIG. 6 shows an embodiment of a storing method according to the invention, FIG. 7 shows an embodiment of a decoding method according to the invention, FIG. 8 shows a diagram explaining the arrangement of surplus bits in a secondary frame, FIG. 9 shows an embodiment of a storing device according to the invention and FIG. 10 shows an embodiment of a decoding device according to the invention.

FIG. 1 shows a diagram explaining how data bits of the secondary channel can be embedded in a main channel. A secondary channel shown is realized via limited multi-level (LML) coding. The limitation consists of the choice that multi-level coding is only applied for runlength $ln_{min}$ or greater, in which $n_{min}$ is a predetermined value. Secondary channel detection is performed on the basis of the signal waveform and checks, via a slicer operation on the amplitude e. g. in the middle of the run, if runs have the secondary channel amplitude effect or not.

For runlength 6T and 7T it is indicated how the secondary bits (LML-bits) are detected. The dashed line 1 indicates the normal slicer level used for detection of the main channel. The dashed line 2 indicates the LML-land slicer level used for detecting the secondary land bits. The dashed line 3 indicates the LML-pit slicer level used for detecting the secondary pit bits. Signal 4 is an original RLL sequence, i. e. a sequence of EFM-coded bits. Depending on the detection with these slicer levels 2 and 3, the character of the LML-bit is indicated by LML=0 or LML=1. The slicer levels 2 and 3 are used to decide if the runs have a secondary amplitude effect or not.

A longer original RLL sequence 4 is shown in FIG. 2. LML=0 and LML=1 under the sequence indicate what sort of secondary bit is present in the indicated runlength.

The arrangement of bits of the secondary channel in secondary frames and the combination of secondary frames forming a superframe is explained with the aid of FIGS. 3 to 6. The format which is shown is especially designed for the storage of MPEG audio data in the secondary channel using LML coding. In order to keep synchronization between MPEG audio data and main channel audio data of a CD, superframes are introduced that correspond to 192 F3-frames of the main channel. In each superframe about 900 bytes have to be stored in a reliable manner.

In order to ensure that the reliability of the data of the secondary channel is not less then that of the main channel and to ensure that always at least 900 user bytes per MPEG packet are available, a format is chosen that operates on blocks consisting of two superframes, i. e. 384 F3-frames, which is called double superframe 5 as indicated in FIG. 3.

The format consists of a 66 times 384 array of so called LML bits. Each column j of the array is associated with the bits of a F3-frame of the main channel being available for the storage of bits of the secondary channel (also called LML channel). Consecutive F3-frames of the array are also written consecutively on the disk.

The LML modulation code is synchronized using the F3-frame-sync. In each column j the upper two bits (block 6) correspond to the LML bits that are written into the two I11's of the F3-frame-sync symbol, while the remaining 64 bits (block 7) are reserved for the LML data bits (frame bits) of the corresponding F3-frame.

The LML bits of the top row of block 6, i. e., the LML-bit in the first I11 of the EFM frame sync of each F3-frame, is reserved for the synchronization of the superframe structure. The LML bits of the second row of block 6, i. e., the LML-bit in the second I1 of the EFM frame sync of each F3-frame, is reserved for the detection of insertions and deletions of long phrases during encoding, decoding or read-out, and for the indication of the presence of a surplus of data bits.

In the remaining 64 positions of each column j forming one secondary frame 11, where $1 \leq j \leq 384$, a random number of LML data bits can be written into the corresponding F3-frame of the main channel. The number $n_j$ of LML data bits (see FIG. 4) that can be stored in each F3-frame j is approximately Gaussian distributed (having a small peak on 63 bits due to the truncation) with a mean of 55.40 bits and a standard deviation of 3.93 bits. For each F3-frame j this number $n_j$ is known as soon as a main channel is CIRC and EFM encoded. The format has been designed such that at most 63 LML bits per F3-frame can be stored. The probability that an F3-frame can accommodate more than 63 LML data bits is 0.02 which is regarded as negligable.

The code according to the invention which is also called ghost-end-of-frame (Ghost-EOF) code consists of a 65 times 384 array of bits as indicated in FIG. 4. Each column j (65 bits) of the code array is associated with one F3-frame of the main channel. The top entry in row 10 of one special bit which is called id-bit is associated with the second I1 of the corresponding F3-frame-sync. Under normal operating conditions the id-bit 111 is defined to be zero if $n_j$ is even and one otherwise. The id-bit 111 is then used for the detection of an insertion or a deletion of an LML bit due to possible confusion of the EFM decoder of the EFM phrase length I4 and I5. A second (joint) use of the id-bit 111 is for the indication of a surplus of user data in that particular column.

The remaining 64 bits in each column are reserved for LML data bits. In each column j an appropriate number $n_j$ of LML data bits is defined, starting from the top. The top-most eight bits (block 9), i. e. the top-most eight bits 112 in each column of the data array 7 are reserved for the parity of the error correcting code. Thereafter $n_j-8$ data bits 113 of user data are arranged in column j. In each column bit $n_j+1$ 114 (end-bit) is defined to be one and the remaining bits 115 (filling bits) are defined to be zero, which definitions can, however, also be reverse. It should be noted that $n_j$ can be at most 63.

For the definition of the error correcting code the data part 7 of the 64 times 384 code array is viewed as an 8 times 384 array of bytes (see FIG. 5). The error correcting code of the code according to the invention consists of 16 codewords of an interleaved [192, 168, 25] Reed Solomon code C over $GF(2^8)$. The none-zero elements of $GF(2^8)$ are generated by a primitive element α, where α is a root of the primitive polynomial $p(x)=x^8+x^4+x^3+x^2+1$ (the same as e. g. used in CD, DVD and DVR). The symbols of $GF(2^8)$ are represented as bytes (groups of 8 bits), using the polynomial base representation with $(\alpha^7, \alpha^6, \alpha^5, \ldots \alpha^2, \alpha, 1)$ as a basis. The root α is thus represented as: α=%00000010. Each codeword has 168 information bytes and 24 parity bytes. Each codeword can be represented as a polynomial c(x) over $GF(2^8)$, $$c(x) = \sum_{i=0}^{191} c_i X^i$$

where c(x) is a multiple of the generator polynomial g(x) of C. The generator polynomial g(x) of C. equals:

$$g(x) = \prod_{i=0}^{23} (x - a^i)$$

The code is systematic in the sense that the information symbols appear unaltered in their specified positions, however, the parity symbols are not at their usual positions (i. e., at the end of the codeword). However, since a Reed Solomon code is MDS (maximum distance separable), any 24 symbols can be defined to be parity symbols.

The interleave scheme has been chosen such that the upper row 9 contains the parity symbols of all codewords and the bottom seven rows in block 8 contain the information symbols of all codewords. Furthermore, each codeword "hits" each row exactly 24 times. This is important because the error rate depends on the row number.

The columns of the array 7 are numbered from 0 up to 383, starting from the right. The 384 columns consist of 192 even columns numbered 0, 2, 4, . . . , 382 and 192 odd columns numbered 1, 3, 5, . . . , 383. The rows are numbered 0 up to 7, starting from the bottom. Writing and reading starts from the left upper corner, i.e., at the high index locations. The sixteen codewords are divided into two sets of eight codewords each. One set lives on the even columns only, and the other set lives on the odd columns only. On both sets of columns, essentially the same interleave scheme is used.

In FIG. 5 some symbols of two different codewords of the odd set are depicted, where the symbols S11, S12, S13 belong to the first codeword and the symbols S21, S22, S23 belong to the second codeword.

The bytes in the 8 times 384 array 7 are characterized by their row and column index, respectively. Hence, the byte in the left upper corner is $b_{7,383}$ and the byte in the right lower corner is $b_{0,0}$. The top entry in the second column (from the left) is $b_{7,382}$. The eight even codewords are numbered $c^{e,0}$ up to $c^{e,7}$. The 8 odd codewords are numbered $c^{o,0}$ up to $c^{o,7}$. Each codeword $c^{x,j}$, where x is odd or even, can be written as a polynomial:

$$c^{x,j}(x) = \sum_{i=0}^{191} c_i^{x,j} x^i, \quad 0 \leq j \leq 7, x \in \{o, e\}$$

The following assignment of codeword symbols to byte numbers of the data array is defined:

$$c_i^{e,j}=b_{i+j \bmod 8, 2i}, \quad c_i^{o,j}=b_{i+j \bmod 8, 2i+1}, \quad 0 \leq i \leq 191, 0 \leq j \leq 7$$

The parity bytes are all in the upper row, i. e., having byte numbers $b_{7,0}$, $b_{7,1}$, $b_{7,2}$, . . . , $b_{7,383}$. In each codeword $c^{x,j}$, the 24 parity bytes are uniformly spaced with seven information bytes (of that codeword) between any two consecutive parity bytes.

The symbols $c^{x,j}_i$ which are parity bytes (arranged in the top row 9) are characterized by the equation $i+j=7 \bmod 8$. Hence, codeword $c^{x,j}$ ($0 \leq j \leq 7$) has the following symbols acting as parity symbols:

$$c^{x,j}_{7-j}, c^{x,j}_{7-j+8}, c^{x,j}_{7-j+16}, c^{x,j}_{7-j+24}, \ldots, c^{x,j}_{7-j+184}$$

Once the array has been Reed Solomon encoded, the top $n_j$ data bits of each column j of the array are scrambled using a parallel block scrambler of size 8 times 384 bytes (so the bottom $64-n_j$ bits in each column are not scrambled). The block scrambler is synchronized to the data array and hence to the F3-frame structure. Hence for each column j, there is a known fixed scrambling sequence of length 64 available that depends on j.

FIG. 6 shows an embodiment of a storing and encoding method according to the invention. A stream of bits of a main channel 20 is first fed into a cross-interleaved Reed Solomon code (CIRC) encoder 21, whose output data 22 are fed into a EFM encoder 23 resulting in encoded user data 24 of the main channel structured in F3-frames.

To a stream of bits of a secondary channel 30 which shall be stored in the frames of the main channel forming a double superframe as shown in FIGS. 3 to 5 a Cyclic Redundancy Check (CRC) is added (block 31). The checked data 32 are then put into the right positions of the superframe as described above (block 33). Therefore the number of LML data bits $n_j$ that can be stored in F3-frame j (with a maximum of 63 bits in each column) is computed for all columns in block 25. The result 26 is forwarded to block 33. In this block the superframe array is filled: the first eight bits in each data column are reserved for the parity bits, the next $n_j-8$ bits are used for storing the user data (inclusive the CRC check bits), thereafter bit $n_j+1$ (end-bit) is set to one in all columns and all remaining bits (filling bits) in each column (if any) are set to zero.

If in one example user data of two MPEG superframes shall be stored in one double superframe then it may be advisable to use the bytes associated with the odd columns for the first MPEG superframe and the bytes associated with the even columns for the second MPEG superframe. If an uncorrectable disc error occurs, with high probability at most one codeword will be uncorrectable. Using the aforementioned construction, at most one MPEG superframe is then corrupted.

The superframes 34 thus filled are then forwarded to step 35 where for each column j an id-bit is set depending on $n_j$ being even or odd. The result 36 is then forwarded to step 37 where in the case that the aggregate amount of available data bits in the superframe is insufficient, some appropriate (e. g. relatively small $n_j$) columns can be selected for storing a conveniently chosen amount of surplus data bits. The end-bit of such columns is shifted down correspondingly whereas the numerical value of $n_j$ remains unchanged. For the columns containing surplus data bits with respect to $n_j$, the id-bit is set to the wrong value with respect to (the original) $n_j$.

The superframes 38 are then forwarded to step 39, where they are encoded using the interleaved [192, 168, 25] Reed Solomon code over $GF2^8$. In this phase, the array is viewed as consisting of 384 columns of eight bytes each. The upper row will contain the parities while the lower seven rows contain the information to be encoded (inclusive the extra end-bit 1 and filling bits that have been padded to each column). The encoding can be performed by an erasure decoder, where the parity symbols have been declared as erasures. Because of the regular spacing of parity symbols within each codeword, where the spacing is relatively prime to 255, a linear feedback shift register encoder can also be constructed.

After this the encoded superframe 40 is forwarded to step 41, where the first n bits of each column j are scrambled using a parallel block scrambler.

After the scrambling, the id-bit and the first $n_j$ (scrambled) bits 42 of each column j are fed to the LML encoder 43, which then adds the superframe sync bits and subsequently modifies the longer phrases of F3-frame j of the encoded data of the main channel 24 accordingly. It should be noted that the last $(64-n_j)$ bits in each column j are not recorded (in particular the end-bit 1 at position $n_j+1$, the filling bits and possibly the surplus information). The term "ghost" in the term "ghost-end-of-frame code" refers to the not recording of the end-bit.

As a result the method as described in FIG. 6 delivers a stream of bits 44 of the main channel in which a number of data bits of a secondary channel are embedded.

A method of decoding a stream of bits 50 is shown in FIG. 7. This stream of bits 50 relates to a main channel in which data bits relating to a secondary channel are embedded.

The bits relating to the main channel are decoded by a conventional decoder 51 having a known EFM demodulator and a known CIRC error correction decoder resulting in a decoded and corrected stream of bits relating to the main channel 52.

The bits relating to the secondary channel are detected using the LML demodulator 53 where an extra bit at each as a longer EFM phrases of the bit stream 50 is obtained. During reading these bits 50 the F3-frame sync and the F3-frame number j are exactly known, as these are provided by the strong CD synchronization mechanism and superframe sync. The superframe sync bit (first I11 of EFM sync) is discarded in the LML demodulator 53.

In the demodulator 53 the id-bit of column j is also read (second I11 of EFM sync), and the corresponding column j is filled with the demodulated LML data bits with a maximum of 63 bits per F3-frame. Behind these bits an additional single end-bit 1 is written into column j and, if necessary, the rest of the column is filled up with zeros. Again, the setting of the bit-values can also be reverse, depending on which definition has been used in the encoder.

In this way a whole superframe 54 is filled up with bits which is then forwarded to step 55.

In step 55 the value of $n_j'$ is determined as this value equals the obtained number of LML data bits in frame j. If $n_j'$ is smaller than 63 (not equal to 63, because insertions/deletions are not well detected in that case), the id-bit is checked against the numerical value of $n_j'$. In case of mismatch a conveniently chosen set of bytes in that column can advantageously be erased, for instance at least those bytes containing bit numbers $n_j'$, and $n_j'+1$ and $n_j'+2$.

The result is forwarded to step 57, where the top $n_j'$ bits of each column j are descrambled using the parallel block scrambler.

A superframe array 58 which is now filled and descrambled is then put into the Reed Solomon decoder for correcting errors and erasures in the array (step 59). The result 60 is put into step 61 where the real value of $n_j$ can reliably be found in each column j by searching for the end-bit being the "lowest" 1-bit in each column. When $n_j$ is thus determined, bit number nine up to bit number $n_j$ in each column j can be output, which then contain the data bits 62 relating to the secondary channel, e. g. the user MPEG information.

CIRC decoding results can additionally be used for declaring erasures for the code according to invention in a kind of limited U-turn construction (limited, because no re-encoding of CIRC and EFM need to be done). Error correcting code capacity of the LML code for massive burst correction can be almost doubled using such a method.

The beginning of each column is reliably determined by the CD EFM sync. The end of the user data in each column is reliably recovered after error correction. If there has been a loss of LML synchronization in the F3-frame number j, this potentially leads to too few or too many LML bits read into column j (deletions or insertions, respectively). Having a wrong number of LML bits demodulated, results in writing the final end-bit 1 at nominal position $n_j+1$ on a wrong position. By the Reed Solomon decoder 59 such an error is recovered and therefore, besides the usual error correction, the correct number $n_j$ can also be found after decoding since the last one in each column is put into the correct position by the Reed Solomon decoder 59. As long as at most one insertion or one deletion has occurred in any F3-frame, this will be indicated by checking the id-bit (provided, this bit is read correctly), thus providing side information to the Reed Solomon decoder.

Synchronization loss before Reed Solomon decoding is limited to one F3-frame, since accounting starts again at each EFM sync symbol, hence the system re-synchronizes after every F3-frame sync. The additive block scrambler 61 also introduces no extra synchronization problems.

It can be concluded that the beginning of each column is reliably found from the EFM synchronization mechanism, while the end (which is a random variable) is reliably found since it is protected by the Reed Solomon code.

The additional one at position $n_j+1$ and the remaining zeros have no influence on the error correcting capabilities of the code if there is no loss of synchronization, because both in the encoder and in the decoder these bits are set to the same values in all columns.

The parities are located in positions that can always be written. Therefore all uncertainties related to the statistical behavior of the number of LML bits are reflected into a stochastic user capacity, while the coding scheme always works. It turns out that the overall LML data capacity of 384 F3-frames is Gaussian distributed with the mean of 2659 bytes and a standard deviation of 9.62 bytes. Subtracting the 384 parity symbols a mean user capacity of 2275 bytes and a standard deviation of 9.62 bytes is left.

Minute changes in the main channel, e. g. a different payload of an additional (e. g. a Buried Data Channel) can lead to a different realization of the EFM phrase distribution. In case of a shortage of user capacity, it can be considered to have multiple LML encoding attempts, each using a slightly different main channel data content.

An option in case of shortage of LML user data capacity is, to trade locally a LML ECC (error correcting code) error correcting power for more user capacity as is explained with the aid of FIG. 8. As indicated there in columns 12 and 13 the value of $n_j$ is artificially enlarged to increase the number of bits, i.e. to add surplus data bits. After encoding according to the invention each of these columns 12, 13 consists of parity bits 122, 132, data bits 123, 133 surplus bits 124, 134 an end-bit and, if necessary, remaining zeros as filling bits. However, in the LML encoder only the top part of these columns (parity bits and data bits) can actually be stored in the available LML bits, but not the surplus data bits 124, 134.

Upon reading the data from the data carrier, also only these top parts of these columns are read from the data carrier. The missing information (surplus bits) of those columns is, however, regarded as synchronization error during Reed Solomon decoding, with high probability indicated by the id-bit, which is set intentionally at the "wrong" value, and will be restored, provided there are not too many other errors.

FIG. 9 shows an embodiment of a storing device 70 according to the invention. The device comprises encoding means 71 for encoding the data bits relating to the main channel 20 in a known manner and encoding means 72 for encoding data bits relating to a secondary channel 30 according to the inventive method described above. The bit streams 24 and 42 of these encoders 71, 72 are forwarded to an LML encoder 43 where the bits 42 relating to the secondary channel are embedded in the frames 24 of the main channel. The resulting signal 44 consist of a bit stream relating to a main channel in which bits relating to a secondary channel are embedded, and has therefore a higher, fixed and guaranteed storage capacity compared to a signal known from prior art. The device 70 can, e. g., be used to store MPEG audio data in the secondary channel which is embedded in a main channel storing audio data. The resulting signal can for example be stored on a CD or a DVD or transmitted over a network like the Internet or over a telephone line.

FIG. 10 shows an embodiment of a decoding device 80 according to the invention. The device comprises reading means 81 for reading a record carrier 82, e.g. a CD or a DVD-ROM. These reading means 81 comprise an optical system for generating a focused light spot on the record carrier 82 and a detector for detecting a reflected light spot. The reading means 81 produce a stream of bits of a signal relating to a binary channel 83. This stream of bits 43 is decoded in a decoder 84 into a stream of bits of a signal relating to a binary source 85. The decoder 84 comprises standard means for decoding a RLL channel code, e. g. $(EFM^+)^{-1}$ and means for error correction, e. g. CIRC-correction, both well known to person skilled in the art. The decoder 84 further comprises means for decoding a secondary channel in accordance with the method according to the invention. The stream of bits of a signal relating to binary source 85 is provided by the device 80 and can be further processed, e. g. for playing audio information or for a screening video information.

While the invention has being described with reference to preferred embodiments thereof, it is to be understood that these are not limitative examples. Thus varies modifications may become apparent to those skilled in the art, without departing from the scope of the invention, as defined in the claims.

The invention is not limited to encoding/decoding of audio-data or to process data for storage on a CD or a DVD. The invention is applicable to any other data which has to be processed and which can be stored on any medium. The invention is further not limited to a special structure of frames of the main channel, secondary frames or superframes or to special coding methods.

Furthermore the invention lies in each and every novel feature or combination of features.

The invention claimed is:

1. A method of storing a number of data bits of a secondary channel (30) in the frame of a main channel (20) comprising a fixed number of main channel bits and a frame synchronization signal, characterized in
    that a secondary frame (11) is formed having a fixed number of frame bits, which frame bits are successively filled with
    a number of data bits (113),
    an end-bit (114), which is set to a first bit-value, and
    filling bits (115), if any, which are set to a second bit-value,
    wherein the number of data bits (113) is dependent on and smaller than a random number ($n_j$) of bits being available in the frame of the main channel (20) for storage of bits of the secondary channel (30),
    that the secondary frame (11) is then encoded using an error correction encoder (39) producing encoded data bits (113) and parity bits (112) and that the encoded data bits (113) and parity bits (112) are embedded in the frame of the main channel (20).

2. A method as claimed in claim 1, characterized in that several secondary frames (11) are combined forming a superframe (5), that the data bits (8) of the superframe (5) are encoded using the error correction encoder (39) and that the symbols (S11, S12, S13, S21, S22, S23) of resulting codewords are distributed in the superframe (5) before embedding them in the frames of the main channel (20).

3. A method as claimed in claim 1, characterized in that after arranging the data bits (113) in the secondary frame (11) an id-bit (111) is set and associated with the secondary frame (11) dependent on the number ($n_j$) of bits available for storage of bits of the secondary channel (30) in the frame of the main channel (20).

4. A method as claimed in claim 1, characterized in
that the encoded data bits (113) and the parity bits (112) are embedded in the frame of the main channel (20) via multi-level coding, that multi-level coding is applied for runlengths $In_{min}$ or greater, in which $n_{min}$ is a predetermined value, and
that the number of data bits (113), which can be stored in a frame of the main channel (20), depends on the number of symbols in the frame having a runlength $In_{min}$ or greater.

5. A method as claimed in claim 1, characterized in that the end-bit (114) is set to one and the filling bits (115) are set to zero.

6. A method of decoding a stream of bits relating to a secondary channel (30) being embedded in the frames of a main channel (20) into a stream of data bits (62), characterized in
that a secondary frame (11) is formed having a fixed number of frame bits, that all bits (112, 113) being embedded in a frame of the main channel (20), an end-bit (114), which is set to a first bit-value, and filling bits (115), if any, which are set to a second bit-value, are successively arranged in the secondary frame (11) and
that the secondary frame (11) is then decoded using an error correction decoder (59) thereby producing the data bits (62).

7. A method as claimed in claim 6, characterized in that a random number ($n_j'$) of bits of the secondary channel (30) being embedded in the frame of the main channel (20) is determined by the error correction decoder (59).

8. A method as claimed in claim 6, characterized in that an id-bit (111), which is set and associated with each secondary frame (11) during the storage of the bits of the secondary channel (30) and which is dependent on a number of bits ($n_j'$) available for storage of bits of the secondary channel (30) in the frame of the main channel (20), is used to check the number ($n_j'$) of bits of the secondary channel (30) being embedded in the frame of the main channel (20).

9. A method as claimed in claim 6, characterized in that the data bits (62) are found in the decoded secondary frame (11) by looking for the end-bit (114) in the decoded secondary frame (11) which is the last bit set to a first bit-value in the decoded secondary frame (11).

10. A method as claimed in claim 6, characterized in that several secondary frames (11) are combined forming a superframe (5) and that the superframe (5) is decoded using the error correction decoder (59).

11. A method as claimed in claim 6, characterized in that the end-bit (114) is set to one and the filling bits (115) are set to zero.

12. A device for storing a number of data bits of a secondary channel (30) in the frame of a main channel (20) comprising a fixed number of main channel bits and a frame synchronization signal, which device comprises storing means (71, 43), characterized in that the storing means (71, 43) are conceived
to form a secondary frame (11) having a fixed number of frame bits, to fill the frame bits successively with
a number of data bits (113),
an end-bit (114), which is set to a first bit-value, and
filling bits (115), if any, which are set to a second bit-value,
wherein the number of data bits (113) is dependent on and smaller than a random number ($n_j$) of bits being available in the frame of the main channel (20) for storage of bits of the secondary channel (30),
to encode the secondary frame (11) using an error correction encoder (39) producing encoded data bits (113) and parity bits (112) and
to embed the encoded data bits (113) and parity bits (112) in the frame of the main channel (20).

13. A device for decoding a stream of bits relating to a secondary channel (30) being embedded in the frames of a main channel (20) into a stream of data bits, which device comprises decoding means (84), characterized in that the decoding means (84) are conceived
to form a secondary frame (11) having a fixed number of frame bits,
to successively arrange all bits (112, 113) being embedded in a frame of the main channel (20), an end-bit (114) which is set to a first bit-value, and filling bits (115), if any, which are set to a second bit-value, in the secondary frame (11) and
to decode the secondary frame (11) using an error correction decoder (59) thereby producing the data bits (62).

14. A medium storing a number of data bits of the secondary channel (30) in the frame of a main channel (20) comprising a fixed number of main channel bits and a frame synchronization signal,
characterized in that
a secondary frame (11) is formed having a fixed number of frame bits, which frame bits are successively filled with
a number of data bit (113),
an end-bit (114), which is set to a first bit-value, and
filling bits (115), if any, which are set to a second bit-value,
wherein the number of data bits (113) is dependent on and smaller than a random number ($n_j$) of bits being available in the frame of the main channel (20) for storage of bits of the secondary channel (30),
the secondary frame (11) being encoded using an error correction encoder (39) producing encoded data bits (113) and parity bits (112), which encoded data bits (113) and parity bits (112) are embedded in the frame of the main channel (20).

15. A signal including a number of data bits of the secondary channel (30) in the frame of a main channel (20) comprising a fixed number of main channel bits and a frame synchronization signal,
characterized in that
a secondary frame (11) is formed having a fixed number of frame bits, which frame bits are successively filled with
a number of data bit (113),
an end-bit (114), which is set to a first bit-value, and filling bits (115), if any, which are set to a second bit-value, wherein the number of data bits (113) is dependent on and smaller than a random number ($n_j$) of bits being available in the frame of the main channel (20) for storage of bits of the secondary channel (30), the secondary frame (11) being encoded using an error correction encoder (39) producing encoded data bits (113) and parity bits (112), which encoded data bits (113) and parity bits (112) are embedded in the frame of the main channel (20).

16. A method for storing supplemental data of a secondary channel, the method comprising performing operations in at least one data processing device, the operations comprising:

receiving main data from a main channel organized into frames, each frame having a number of free bits;

selecting from the supplemental data a plurality of one-dimensional sub-arrays, a size of each one-dimensional sub-arrays being dependent on the number of free bits in a current frame of the main channel;

subjecting each one-dimensional sub-array to a respective encoding process, separate from any coding of the main data to protect against data loss to yield a respective encoded one-dimensional sub-arrays;

inserting the encoded one-dimensional sub-arrays into a respective plurality of frames of the main data to create combined frames;

reorganizing at least some of the combined frames into at least one superframe, each superframe comprising a two dimensional array of the supplemental data spread across its frames as encoded one-dimensional sub-arrays; and storing the superframe.

17. The method of claim 16, further comprising, prior to storing, subjecting the combined frames or the superframes or both to additional coding, to protect against data loss.

18. The method of claim 16, wherein the supplemental data comprises sections having respective run-lengths. the organizing operation further comprises, in order not to split a section between distinct one-dimensional sub-arrays, inserting at least one fill bit into at least one of the one-dimensional sub-arrays.

19. The method of claim 16, wherein each one-dimensional sub-array comprises an end bit.

* * * * *